United States Patent
Grötsch et al.

(10) Patent No.: US 8,299,484 B2
(45) Date of Patent: Oct. 30, 2012

(54) OPTOELECTRONIC SEMICONDUCTOR CHIP

(75) Inventors: Stefan Grötsch, Bad Abbach (DE); Norbert Linder, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 186 days.

(21) Appl. No.: 12/666,557

(22) PCT Filed: Jun. 23, 2008

(86) PCT No.: PCT/DE2008/001050
§ 371 (c)(1), (2), (4) Date: Jun. 28, 2010

(87) PCT Pub. No.: WO2009/000257
PCT Pub. Date: Dec. 31, 2008

(65) Prior Publication Data
US 2010/0295073 A1    Nov. 25, 2010

(30) Foreign Application Priority Data

Jun. 26, 2007 (DE) .......................... 10 2007 029 391

(51) Int. Cl.
| | | |
|---|---|---|
| H01L 29/22 | (2006.01) |
| H01L 29/227 | (2006.01) |
| H01L 33/00 | (2010.01) |
| H01L 29/732 | (2006.01) |
| H01L 31/0328 | (2006.01) |
| H01L 31/0336 | (2006.01) |
| H01L 31/072 | (2012.01) |
| H01L 31/109 | (2006.01) |
| H01L 31/062 | (2012.01) |
| H01L 31/113 | (2006.01) |
| H01L 31/06 | (2012.01) |

(52) U.S. Cl. .......... 257/98; 257/186; 257/292; 257/293; 257/462; 257/E31.052; 257/E31.053; 257/E31.058; 257/E31.063; 257/E31.069; 257/E31.073; 257/E31.079; 257/E31.082; 257/E31.096; 257/E31.115; 257/E31.121; 257/E33.076; 257/E33.077

(58) Field of Classification Search .................. 257/186, 257/292, 293, 462, E31.052, E31.053, E31.058, 257/E31.063, E31.069, E31.073, E31.079, 257/E31.082, E31.096, E31.115, E31.121, 257/E33.076, E33.077, 98
See application file for complete search history.

(56) References Cited

U.S. PATENT DOCUMENTS

| | | | |
|---|---|---|---|
| 367,819 A | 8/1887 | Macomb | |
| 5,117,469 A * | 5/1992 | Cheung et al. .................. 385/11 |

(Continued)

FOREIGN PATENT DOCUMENTS

DE    33 11 402    10/1983

(Continued)

*Primary Examiner* — Ida M Soward
(74) *Attorney, Agent, or Firm* — Cozen O'Connor

(57) ABSTRACT

An optoelectronic semiconductor chip including a radiation passage area, where a contact metallization is applied to the radiation passage area, and a first reflective layer sequence is applied to that surface of the contact metallization which is remote from the radiation passage area, and an optoelectronic component that includes such a chip.

14 Claims, 4 Drawing Sheets

U.S. PATENT DOCUMENTS

| | | | |
|---|---|---|---|
| 5,283,447 A * | 2/1994 | Olbright et al. | 257/85 |
| 5,331,654 A * | 7/1994 | Jewell et al. | 372/45.01 |
| 5,813,752 A | 9/1998 | Singer et al. | |
| 5,837,561 A * | 11/1998 | Kish et al. | 438/47 |
| 6,111,272 A | 8/2000 | Heinen | |
| 6,404,125 B1 * | 6/2002 | Garbuzov et al. | 313/499 |
| 6,985,281 B2 * | 1/2006 | Wagner et al. | 359/315 |
| 7,009,215 B2 * | 3/2006 | D'Evelyn et al. | 257/98 |
| 7,023,026 B2 * | 4/2006 | Yamamoto | 257/103 |
| 7,057,212 B2 | 6/2006 | Kim et al. | |
| 7,162,109 B2 * | 1/2007 | Nakada et al. | 385/2 |
| 7,265,392 B2 | 9/2007 | Hahn et al. | |
| 7,467,885 B2 * | 12/2008 | Grotsch et al. | 362/555 |
| 7,496,123 B2 * | 2/2009 | Ueki et al. | 372/38.05 |
| 7,598,529 B2 * | 10/2009 | Ploessl et al. | 257/90 |
| 7,622,746 B1 * | 11/2009 | Lester et al. | 257/98 |
| 7,815,854 B2 * | 10/2010 | Cohen | 422/423 |
| 2001/0043629 A1 * | 11/2001 | Sun et al. | 372/43 |
| 2004/0150997 A1 | 8/2004 | Ouderkirk et al. | |
| 2005/0087884 A1 * | 4/2005 | Stokes et al. | 257/778 |
| 2006/0131597 A1 | 6/2006 | Lee et al. | |
| 2008/0089376 A1 * | 4/2008 | Anan | 372/46.013 |

FOREIGN PATENT DOCUMENTS

| | | |
|---|---|---|
| DE | 100 26 254 | 11/2001 |
| DE | 103 29 364 | 2/2005 |
| DE | 10 2004 029 216 | 8/2005 |
| EP | 0 905 797 | 8/1998 |
| EP | 1 403 689 | 3/2004 |
| EP | 1 577 700 | 3/2005 |
| JP | 57-040986 | 3/1982 |
| JP | 04-361572 | 12/1982 |
| JP | 6-310757 | 11/1994 |
| JP | 2006/041133 | 2/2006 |
| JP | 2006128450 A * | 5/2006 |
| JP | 2007-103689 | 4/2007 |
| WO | WO 02/09243 | 1/2002 |
| WO | WO 02/13281 | 2/2002 |
| WO | WO 2004/112157 | 12/2004 |
| WO | WO 2006/035388 | 4/2006 |

* cited by examiner

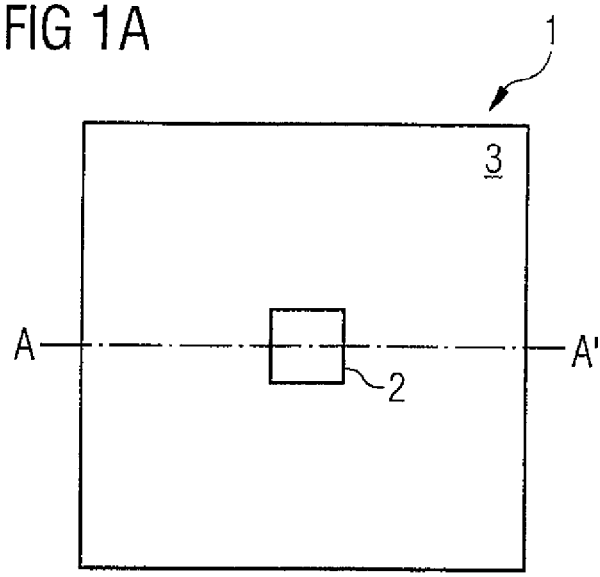
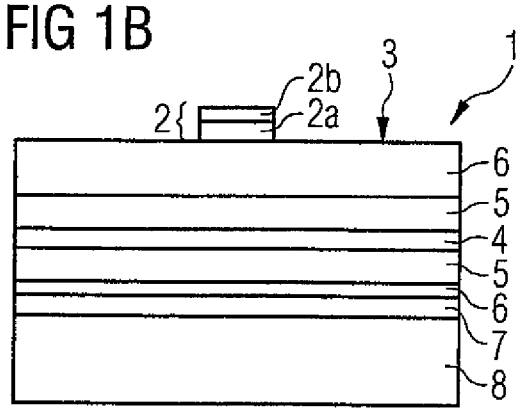
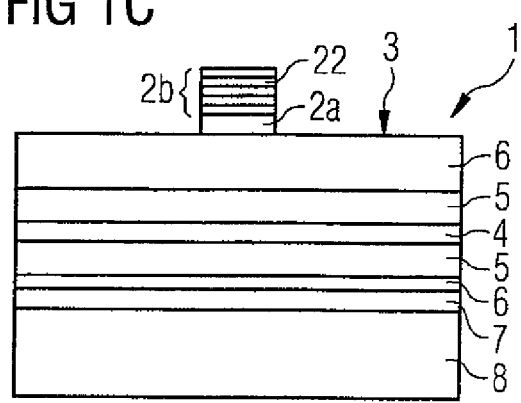

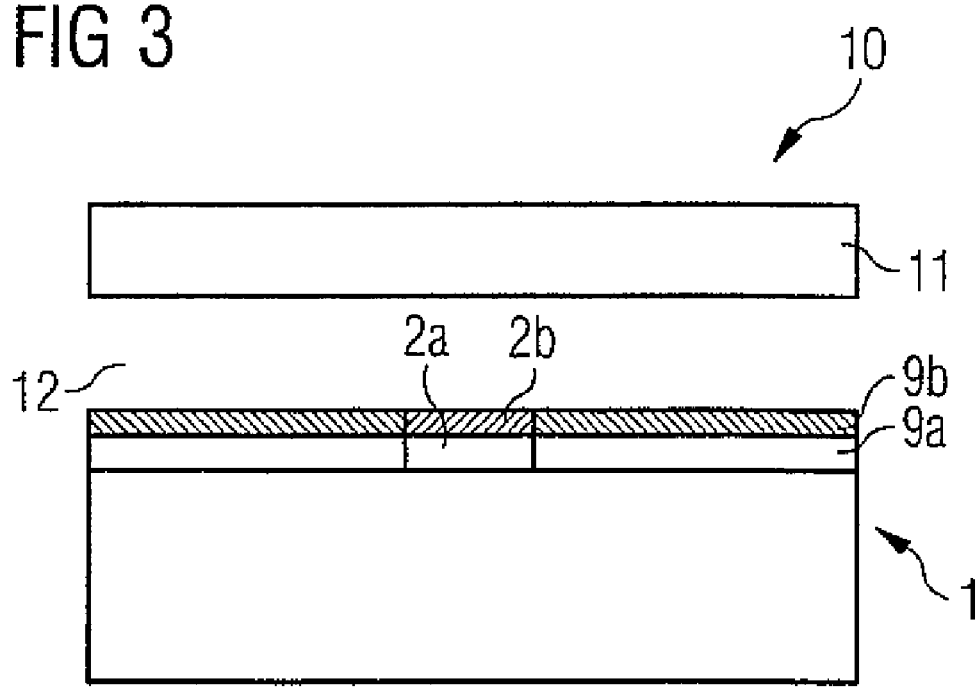
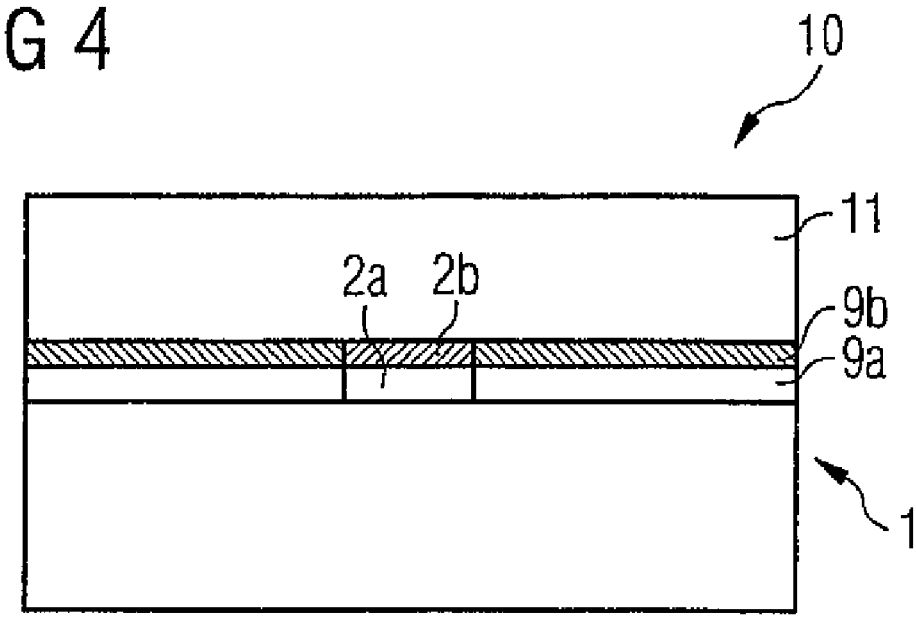

OPTOELECTRONIC SEMICONDUCTOR CHIP

RELATED APPLICATIONS

This is a U.S. national stage of application No. PCT/DE2008/001050, filed on Jun. 23, 2008.

This application claims the priority of German application no. 10 2007 029 391.9 filed Jun. 26, 2007, the entire content of which is hereby incorporated by reference.

FIELD OF THE INVENTION

The present invention is related to an optoelectronic semiconductor chip.

BACKGROUND OF THE INVENTION

The documents WO 02/13281 A1 and EP 0 905 797 A2 (U.S. Pat. No. 6,111,272 A) describe optoelectronic semiconductor chips and methods for producing the latter.

SUMMARY OF THE INVENTION

One object to be achieved is to provide an optoelectronic semiconductor chip which can be operated particularly efficiently.

In accordance with at least one embodiment, the optoelectronic semiconductor chip comprises a semiconductor body with a radiation passage area. The radiation passage area is formed for example by a part of the surface of the semiconductor body. Electromagnetic radiation generated in the semiconductor chip can leave the semiconductor body through the radiation passage area. Furthermore, it is also possible for electromagnetic radiation to be coupled into the semiconductor body from outside through the radiation passage area.

In accordance with at least one embodiment, the optoelectronic semiconductor chip furthermore comprises a contact metallization. The contact metallization is arranged for example on the radiation passage area of the optoelectronic semiconductor chip. That is to say that the contact metallization is then applied to the radiation passage area of the optoelectronic semiconductor chip and covers said area in places or at least in places. The contact metallization can be used to make electrical contact with the optoelectronic semiconductor chip on the n or p side, for example. An electric current for operating the chip is then impressed into the optoelectronic semiconductor chip by means of the contact metallization.

In accordance with at least one embodiment of the optoelectronic semiconductor chip, a first reflective layer sequence is applied to that surface of the contact metallization which is remote from the radiation passage area. That is to say that the contact metallization is covered by the first reflective layer sequence at least in places.

The reflective layer sequence comprises at least one layer. However, the reflective layer sequence can also comprise a plurality of layers. The reflective layer sequence is distinguished by the fact that it has—at least for electromagnetic radiation in a specific wavelength range—a higher reflectivity than the contact metallization. That is to say that electromagnetic radiation in at least one specific wavelength range is reflected better by the first reflective layer sequence than would be the case upon said electromagnetic radiation impinging on the contact metallization. By way of example the first reflective layer sequence has an increased reflectivity, compared with the contact metallization, for electromagnetic radiation generated in the optoelectronic semiconductor chip.

In accordance with at least one embodiment, the optoelectronic semiconductor chip comprises a radiation passage area, a contact metallization applied to the radiation passage area, and a first reflective layer sequence applied to that surface of the contact metallization which is remote from the radiation passage area, wherein the reflective layer sequence is provided for reflecting electromagnetic radiation reflected back to the contact metallization.

An optoelectronic semiconductor chip described here is in this case based on the following considerations, inter alia: it has been found that, by way of example, when light emitting diode chips are used in optical systems in which light is reflected back onto the light emitting diode chip—that is to say onto the radiation passage area for example—a significant loss mechanism resides in the fact that the contact metallization of the optoelectronic semiconductor chip has a low reflectivity and absorbs the radiation reflected back. That is to say that electromagnetic radiation generated in the semiconductor chip is reflected back at an optical element disposed downstream of the semiconductor chip, for example, in the direction of the semiconductor chip. In this case, a portion of this radiation can impinge on the contact metallization and is absorbed by the latter. This absorbed radiation is lost to photon recycling in the semiconductor chip, for example.

By means of the first reflective layer sequence arranged on this contact metallization, it is possible to increase the reflectivity of the contact location composed of contact metallization with first reflective layer sequence applied to the contact metallization. In this way, the electromagnetic radiation reflected back onto the light emitting diode chip is not lost, but rather can be reflected back into the optical system, for example, after reflection at the first reflective layer sequence. For this purpose, the reflective layer sequence preferably has a reflectivity of at least 90% for electromagnetic radiation generated in the semiconductor chip.

The contact metallization is for example a bonding pad provided for wire contact-connection of the semiconductor chip.

In accordance with at least one embodiment of the optoelectronic semiconductor chip, the first reflective layer sequence comprises at least one metal. The metal can be for example aluminum or silver or an alloy composed of these metals. Furthermore, it is possible for the reflective layer sequence to comprise a plurality of layers which are each formed from aluminum and/or silver or contain aluminum and/or silver. The contact metallization itself, to which the first reflective layer sequence is applied, can for example consist of gold or contain gold.

In accordance with at least one embodiment of the optoelectronic semiconductor chip, the first reflective layer sequence comprises at least one layer which contains a dielectric material. By way of example, this layer can be applied to that surface of the second reflective layer sequence which is remote from the radiation passage area, and can form a passivation for a reflective metal layer.

However, it is also possible for the first reflective layer sequence to contain a plurality of layers of the same or different dielectric materials. By way of example, the first reflective layer sequence can then consist of a sequence of first dielectric layers having a lower refractive index, at least one second dielectric layer having a higher refractive index being arranged in each case between two layers having a low refractive index. The alternating dielectric layers having different refractive indices can then form a Bragg or Bragg-like mirror, for example.

In accordance with at least one embodiment of the optoelectronic semiconductor chip, at least one current spreading track is applied to the radiation passage area of the optoelectronic semiconductor chip. In this case, the current spreading track is electrically conductively connected to the contact metallization. The current spreading track is provided for spreading electromagnetic current impressed by means of the contact metallization over the radiation passage area. What can be achieved in this way is that electric current is impressed as uniformly as possible into an active zone of the optoelectronic semiconductor chip. What can be achieved in this way is that electromagnetic radiation can be generated as uniformly as possible in the active zone of the optoelectronic semiconductor chip. In this case, the optoelectronic semiconductor chip can comprise a multiplicity of current spreading tracks which are electrically conductively connected to the contact metallization and spread the current over the radiation passage area.

In accordance with at least one embodiment of the optoelectronic semiconductor chip, the current spreading track comprises a current spreading metallization applied to the radiation passage area of the optoelectronic semiconductor chip. In this case, the current spreading metallization can be formed from the same material as the contact metallization and is applied to the radiation passage area of the semiconductor chip in the same production step as the contact metallization, for example. In this case, the current spreading metallization contains or consists for example of at least one of the following materials: gold, transparent conductive oxide (TCO) such as ITO (indium tin oxide). The current spreading track furthermore comprises a second reflective layer sequence applied to that surface of the current spreading metallization which is remote from the radiation passage area, wherein the second reflective layer sequence is provided for reflecting electromagnetic radiation reflected back to the current spreading metallization.

In accordance with at least one embodiment of the optoelectronic semiconductor chip, the second reflective layer sequence comprises at least one layer which contains a metal. The metal is for example aluminum, silver or an alloy composed of the two metals. By way of example, the second reflective layer sequence can comprise a plurality of layers which consist of aluminum and/or silver or contain aluminum and/or silver.

In accordance with at least one embodiment of the optoelectronic semiconductor chip, the second reflective layer sequence comprises at least one layer which contains a dielectric material. By way of example, this layer can be applied to that surface of the second reflective layer sequence which is remote from the radiation passage area, and can form a passivation for a reflective metal layer. Furthermore, it is possible for the second reflective layer sequence to comprise a plurality of dielectric layers, wherein, by way of example, mutually adjacent layers can have different refractive indices, such that the second reflective layer sequence forms a Bragg-like mirror or a Bragg mirror.

In accordance with at least one embodiment, the second reflective layer sequence differs from the first reflective layer sequence in terms of its composition. This can be achieved for example by virtue of the second reflective layer sequence comprising dielectric layers, the first reflective layer sequence comprising only metallic layers. In this way, it is possible in a particularly simple manner for electrical contact to be able to be made with the chip after the completion of the first and second reflective layer sequences by means of a contact wire at the contact location, since the latter is then not covered by dielectric layers.

As an alternative it is also possible, however, for the first and the second reflective layer sequences to be constructed identically and for both layer sequences to comprise at least one dielectric layer. By way of example, a conductive connection between a contact wire and the contact metallization can then be produced by means of etching or a mask technique.

An optoelectronic semiconductor component is furthermore specified. In accordance with at least one embodiment of the optoelectronic semiconductor component, the component comprises an optoelectronic semiconductor chip in accordance with at least one of the exemplary embodiments described further above. Furthermore, the optoelectronic semiconductor component comprises an optical filter element disposed downstream of the optoelectronic semiconductor chip in an emission direction, said optical filter element being suitable for transmitting a first radiation component having a first radiation property and for reflecting a second radiation component having a second radiation property, which differs from the first radiation property.

In this case, the optical filter element is disposed downstream of the optoelectronic semiconductor chip in such a way that at least a part—preferably a major part—of the electromagnetic radiation emitted by the optoelectronic semiconductor chip during operation passes to the optical filter element and is transmitted or reflected there.

The reflected radiation component not transmitted by the optical filter element impinges on the radiation passage area of the optoelectronic semiconductor chip, where the radiation is either coupled into the optoelectronic chip again or reflected back at the radiation passage area toward the optical filter element or reflected back at the first or second reflective layer sequence, which is applied on the contact metallization or on the current spreading metallization, respectively, to the optical filter element. The electromagnetic radiation coupled into the optoelectronic semiconductor chip through the radiation passage area can be reflected by the chip or else absorbed and re-emitted. The electromagnetic radiation is therefore photon-recycled in this case.

Overall, an optoelectronic semiconductor chip in which the reflectivity of the contact location and of the current spreading tracks, respectively, is increased by means of first and second reflective layer sequences, in an optoelectronic component comprising an optical filter element disposed downstream, proves to be particularly advantageous since first and second reflective layer sequences applied to the contact location and the current spreading tracks, respectively, make absorption of the impinging radiation there less probable or completely prevent it.

In this way, the efficiency of the optoelectronic component is increased by comparison with optoelectronic components comprising semiconductor chips which have no reflective layer sequences.

Preferably, the first radiation property is complementary to the second radiation property. Furthermore, the radiation property can be understood to mean the direction, the polarization or the wavelength of the radiation. For the purposes of the optoelectronic semiconductor component described here, a first direction of electromagnetic radiation lies within a first solid angle range, while a second direction of electromagnetic radiation lies in a solid angle range complementary to the first solid angle range. Furthermore, a first polarization can correspond to a parallel polarization and a second polarization can correspond to a perpendicular polarization. Finally, a second wavelength complementary to the first wavelength can be a wavelength that differs from the first wavelength, in which case complementary should not necessarily be understood in the narrow sense of chromatics.

In accordance with at least one embodiment of the optoelectronic semiconductor component, the optical filter element comprises a dichroic filter which transmits electromagnetic radiation having a first wavelength or in a first wavelength range and reflects electromagnetic radiation having a second wavelength or in a second wavelength range.

In accordance with at least one embodiment of the optoelectronic semiconductor component, the optical filter element comprises a polarization filter which transmits electromagnetic radiation having a first polarization and reflects electromagnetic radiation having a second polarization.

In accordance with at least one embodiment of the optoelectronic semiconductor component, the optical filter element comprises an angle filter which transmits electromagnetic radiation having a first direction, while the electromagnetic radiation having a second direction is reflected.

In accordance with at least one embodiment of the optoelectronic semiconductor component, the optical filter element comprises a luminescence conversion material which generates, from at least one portion of the electromagnetic radiation emitted by the semiconductor chip, wavelength-converted radiation having wavelengths that differ from the wavelengths of the radiation generated by the semiconductor chip.

BRIEF DESCRIPTION OT THE DRAWINGS

The optoelectronic semiconductor chip described here and the optoelectronic semiconductor component described here are explained in greater detail below on the basis of exemplary embodiments and the associated figures.

FIG. 1A shows a schematic plan view of an optoelectronic semiconductor chip in accordance with a first and a second exemplary embodiment.

FIG. 1B shows a schematic sectional illustration of an optoelectronic semiconductor chip in accordance with the first exemplary embodiment.

FIG. 1C shows a schematic sectional illustration of an optoelectronic semiconductor chip in accordance with the second exemplary embodiment.

FIG. 3 shows a schematic sectional illustration of an optoelectronic semiconductor component in accordance with a first exemplary embodiment.

FIG. 4 shows a schematic sectional illustration of an optoelectronic semiconductor component in accordance with a second exemplary embodiment.

DETAILED DESCRIPTION OF THE DRAWINGS

Figure 2A:
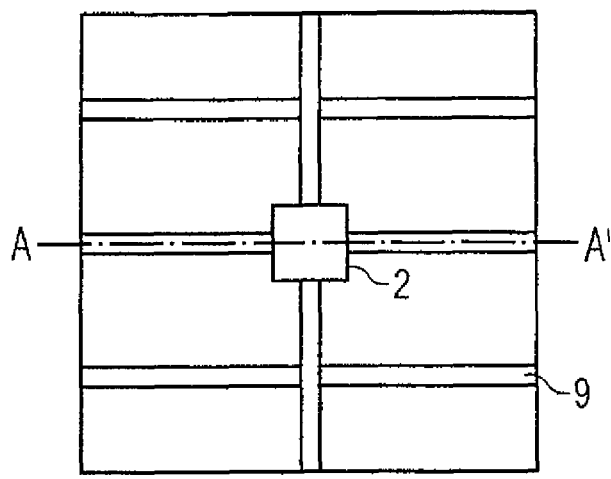
FIG. 2A shows a schematic plan view of an optoelectronic semiconductor chip in accordance with a third and a fourth exemplary embodiment.

Identical or identically acting constituent parts are in each case provided with the same reference symbols in the exemplary embodiments and figures. The elements illustrated should not be regarded as true to scale; rather, individual elements may be illustrated with an exaggerated size in order to afford a better understanding.

FIG. 1A shows a schematic plan view of an optoelectronic semiconductor chip 1 in accordance with a first and a second exemplary embodiment. FIG. 1B shows a sectional illustration along the line AA' in accordance with the first exemplary embodiment. FIG. 1C shows a sectional illustration along the line AA' in accordance with the second exemplary embodiment.

In accordance with the first exemplary embodiment, the optoelectronic semiconductor chip comprises a carrier 8. The carrier 8 can be for example a growth substrate onto which semiconductor layers of the optoelectronic semiconductor chip are deposited epitaxially. However, it is also possible for the carrier 8 to be a carrier which is applied to that surface of the semiconductor chip which is remote from the original growth substrate. The growth substrate is then thinned or completely removed. In this case, the semiconductor chip 1 can be a so-called thin-film semiconductor chip, in particular. Light emitting diode chips of thin-film design are described for example in the documents WO 02/13281 A1 and EP 0 905 797 A2, the disclosure content of which with regard to the thin-film design is hereby expressly incorporated by reference.

The exemplary embodiments of the optoelectronic semiconductor chip 1 that are described in conjunction with FIGS. 1B and 1C involve thin-film chips. In this case, the carrier 8 is succeeded by a reflective layer or layer sequence 7 provided for reflecting radiation that enters into the semiconductor chip 1 or is generated in the semiconductor chip 1. Arranged on that side of the mirror layer 7 which is remote from the carrier is a scattering layer 6, which is optional and enables the scattering of the electromagnetic radiation passing in the direction of the mirror layer 7 or the electromagnetic radiation reflected by the mirror layer 7. Furthermore, the optoelectronic semiconductor chip comprises an active zone 4 provided for generating radiation. For this purpose, the active zone 4 can comprise a plurality of semiconductor layers. By way of example, the active layer comprises a pn junction, a heterostructure, a single quantum well structure and/or a multiple quantum well structure. The designation quantum well structure also encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The active zone 4 is surrounded by cladding layers 5, which are n- and p-doped, respectively. Furthermore, the optoelectronic semiconductor chip has a second scattering layer 6, which is applied to that surface of a cladding layer 5 which is remote from the active zone 4, and is likewise optional. This scattering layer 6 also serves for scattering the radiation that enters into the optoelectronic semiconductor chip or emerges from the optoelectronic semiconductor chip through the radiation passage area 3. A contact location 2 is applied to the radiation passage area 3. In the exemplary embodiment described in conjunction with FIG. 1B, the contact location 2 comprises a contact metallization 2a, which is applied directly to the radiation passage area 3 and consists of gold, for example. A first reflective layer sequence 2b is applied to the contact metallization 2a, said layer sequence in the present case containing a single layer, which consists of aluminum, silver or an aluminum-silver alloy, for example. In comparison with the contact metallization 2a, the first reflective layer sequence 2b has an increased reflectivity for electromagnetic radiation generated in the optoelectronic semiconductor chip 1. It is furthermore possible for the first reflective layer sequence 2b to have an increased reflectivity for electromagnetic radiation generated outside the semiconductor chip 1, for example for wavelength-converted radiation.

In the second exemplary embodiment described in conjunction with FIG. 1C, the second reflective layer sequence 2b comprises a multiplicity of layers 22. By way of example, these layers can be a succession of metallic layers which can be formed alternately from aluminum and silver. Furthermore, it is possible for the outermost layer remote from the radiation passage area 3, for example, to be a dielectric layer serving for passivation of the underlying metallic layers. Furthermore, it is possible, moreover, for the second reflective layer sequence to consist of a succession of dielectric layers which form a Bragg mirror or a Bragg-like mirror, for example.

Figure 2B:
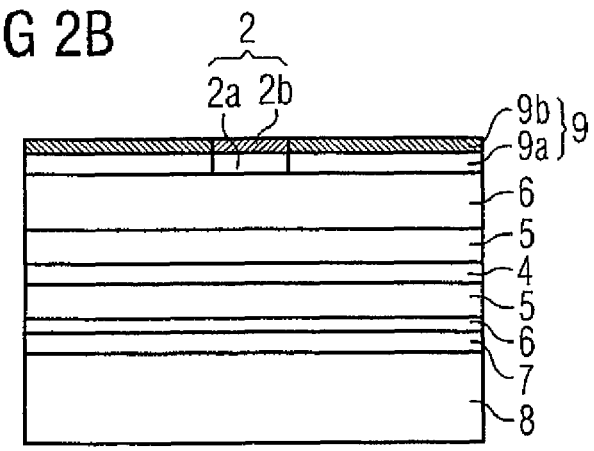
FIG. 2B shows a schematic sectional illustration of an optoelectronic semiconductor chip in accordance with the third exemplary embodiment.
Figure 2C:
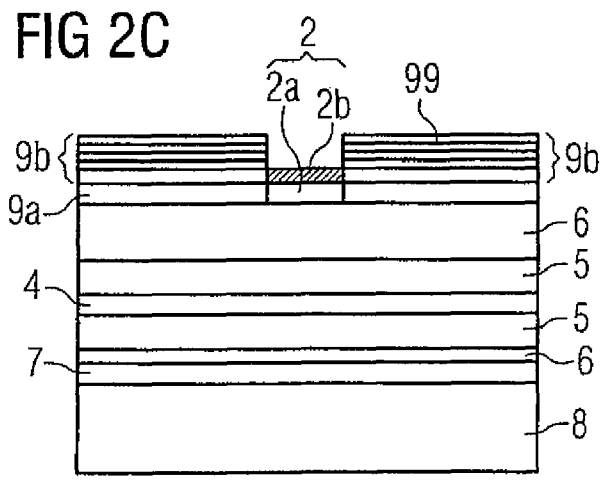
FIG. 2C shows a schematic sectional illustration of an optoelectronic semiconductor chip in accordance with the fourth exemplary embodiment.

FIG. 2A shows a schematic plan view of an optoelectronic semiconductor chip in accordance with a third and fourth exemplary embodiment. FIGS. 2B and 2C show schematic sectional illustrations along the section line AA' for the third and for the fourth exemplary embodiment, respectively, of the optoelectronic semiconductor chip. In the exemplary embodiments of the optoelectronic semiconductor chip that are described in conjunction with FIGS. 2A, 2B, 2C, current spreading tracks 9 are applied to the radiation passage area. The current spreading tracks 9 are electrically conductively connected to the contact location 2 and serve for uniformly spreading the electric current impressed at the contact location 2 over the entire radiation passage area 2. This ensures that the active zone 4 can be uniformly energized.

In the exemplary embodiment described in conjunction with FIG. 2B, the contact location 2 is formed by a contact metallization 2a and a reflective layer sequence 2b, as also described in conjunction with FIG. 1B. The current spreading tracks 9 each comprise current spreading metallizations 9a, which consist of gold, for example, and second reflective coatings 9b applied to that surface of the current spreading metallization which is remote from the radiation passage area 3. These second reflective layer sequences 9b can be constructed like the first reflective layer sequences 2b, see FIG. 2B.

Furthermore, it is possible, as shown in conjunction with FIG. 2C, for the second reflective layer sequences 9b to be constructed differently than the first reflective layer sequences 2b. By way of example, the first reflective layer sequence 2b can be formed in metallic fashion, while the second reflective layer sequence 9b can contain a dielectric material and forms a Bragg mirror or a Bragg-like mirror, for example. The second reflective layer sequence 9b then has individual layers 99 consisting of a dielectric material, the refractive index of an individual layer 99 differing from an adjacent individual layer.

FIG. 3 shows a first exemplary embodiment of an optoelectronic semiconductor component 10 described here. The optoelectronic semiconductor component 10 comprises an optoelectronic semiconductor chip 1 as described for example in conjunction with FIGS. 1A, 1B, 1C, 2A, 2B, 2C. Furthermore the optoelectronic semiconductor component comprises an optical filter element 11. The optical filter element 11 is for example a polarization filter, a dichroic filter, a luminescence conversion material, which can be present in one layer, for example, or an angle filter.

If the filter element 11 is a polarization filter, for example, then electromagnetic radiation, generated in the active zone 4 of the optoelectronic semiconductor chip 1, having a first polarization direction is transmitted. The rest of the electromagnetic radiation is then reflected back to the optoelectronic semiconductor chip by the optical filter element. At said chip, the radiation can be reflected either by the mirror layer 7, the radiation passage area 3 or the first reflective layer sequence 2b or the second reflective layer sequence 9b.

The polarization direction can be altered during each reflection process. Moreover, the electromagnetic radiation can be absorbed in the active zone 4 and subsequently be re-emitted with a changed polarization direction. The electromagnetic radiation reflected and re-emitted in this way then has a polarization component that is transmitted by the optical filter element 11. The rest of the radiation experiences further cycles with the reflection or absorption processes described above.

If the optical filter element 11 is a dichroic filter, then electromagnetic radiation which has a specific wavelength or originates from a specific wavelength range is transmitted. The rest of the electromagnetic radiation, as described above, is reflected by the optical filter element and finally reabsorbed and re-emitted in the active zone 4.

If the optical filter element 11 is an angle filter, then only electromagnetic radiation which has a direction that lies in a specific solid angle range is transmitted. In particular, it is thereby possible, in a simple manner, to increase the luminance of the optoelectronic semiconductor component by restricting the emission angle to a narrow range. Non-transmitted electromagnetic radiation is reflected back onto the chip again and from there is reflected again toward the optical filter element. In this case, a plurality of reflections can take place until the electromagnetic radiation has a direction in which it can pass through the angle filter.

If the optical filter element is a luminescence conversion material, then converted electromagnetic radiation that is backscattered by the luminescence conversion material or emitted in the direction of the radiation passage area 3 is reflected back by the radiation passage area 3, the first reflective layer sequence 2b and/or the second reflective layer sequence 9b into the luminescence conversion material, where it can then be transmitted or once again wavelength-converted by the luminescence conversion material.

In the exemplary embodiment of the optoelectronic semiconductor component described in conjunction with FIG. 3, a gap 12 is arranged between the optoelectronic semiconductor chip 1 and the optical filter element 11. Said gap 12 can be filled with air, for example.

In the exemplary embodiment of the optoelectronic semiconductor component described in conjunction with FIG. 4, the optical filter element 11 is arranged directly on the optoelectronic semiconductor chip 1, such that no gap 12 is situated between optoelectronic semiconductor chip and optical filter element.

Figure 5:
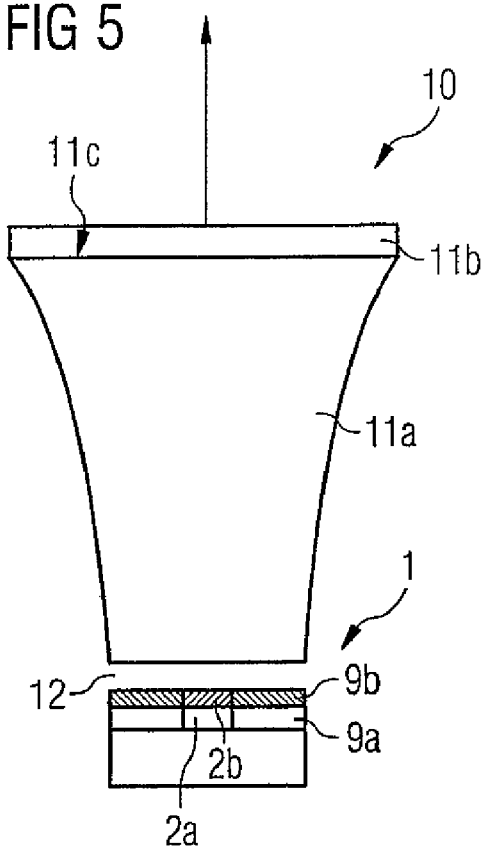
FIG. 5 shows a schematic sectional illustration of an optoelectronic semiconductor component in accordance with a third exemplary embodiment.

In the exemplary embodiment in FIG. 5, the optical filter element 11 comprises an optical body 11a, which comprises for example a reflective optical unit such as a reflector and/or an optical concentrator, for instance a CPC (compound parabolic concentrator), a CHC (compound hyperbolic concentrator) or CEC (compound elliptic concentrator). A filter layer 11b is then applied to a radiation passage area 11c of the optical body 11a. The filter layer 11b can be formed like the optoelectronic filter element 11 described in conjunction with FIG. 3.

Figure 6:
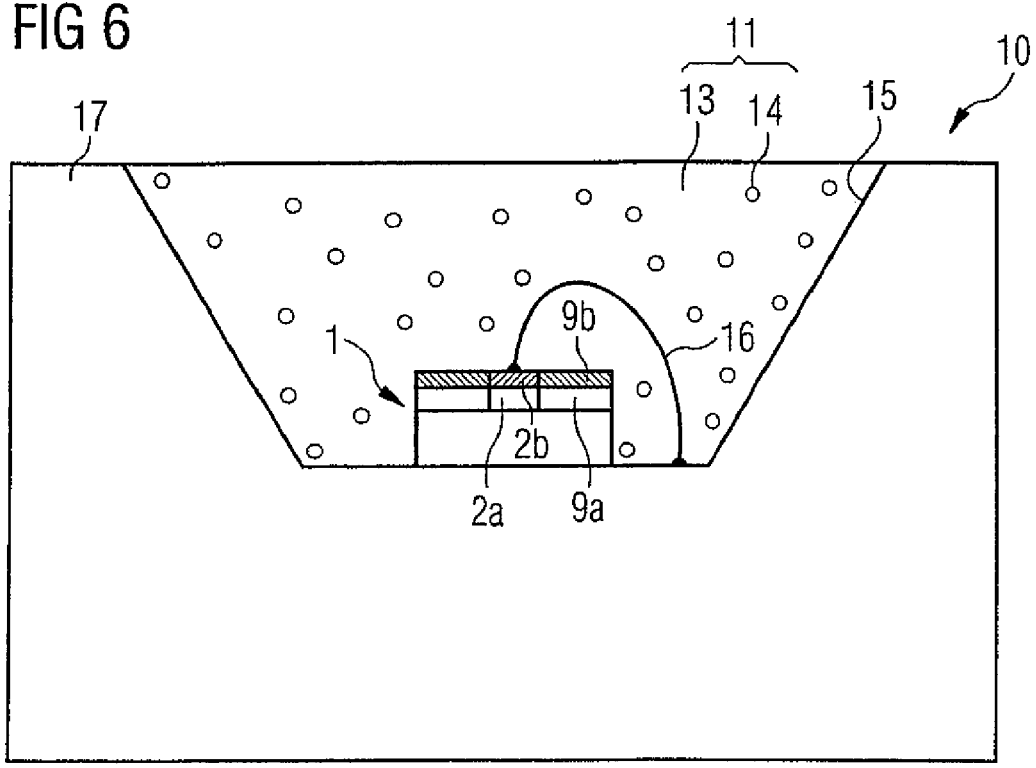
FIG. 6 shows a schematic sectional illustration of an optoelectronic semiconductor component in accordance with a fourth exemplary embodiment.

A further exemplary embodiment of an optoelectronic semiconductor component described here is shown in conjunction with FIG. 6.

In this exemplary embodiment, the optical filter element is formed by luminescence conversion particles arranged in a potting compound 13. The potting compound 13 with the luminescence conversion particles 14 forms a luminescence conversion material. Furthermore, the filter element comprises reflector walls 15 formed for example by inclined inner walls of a housing 17 for the optoelectronic semiconductor chip. Electromagnetic radiation generated in the semiconductor chip 1 can be reflected back onto the semiconductor chip by the reflector walls 15 or the luminescence conversion particles 14. This radiation is reflected at the radiation passage area 3, the first reflective layer sequence 2b, the second reflective layer sequence 9b or the mirror layer 7.

In all the exemplary embodiments of the optoelectronic semiconductor component described here, the first and second reflective layer sequences improve the efficiency of the component since electromagnetic radiation impinging on the contact location 2 and the current spreading tracks 9, respectively, is not absorbed there, but rather is reflected for further use.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
    a radiation passage area;
    a contact metallization applied to the radiation passage area; and
    a first reflective layer sequence applied to that surface of the contact metallization which is remote from the radiation passage area; and
    at least one current spreading track applied to the radiation passage area and electrically conductively connected to the contact metallization, the at least one current spreading track including a current spreading metallization and a second reflective layer sequence applied to that surface of the current spreading metallization which is remote from the radiation passage area;
    wherein the reflective layer sequence is provided for reflecting electromagnetic radiation reflected back to the contact metallization; and
    wherein the second reflective layer sequence is provided for reflecting electromagnetic radiation reflected back to the current spreading metallization.

2. The optoelectronic semiconductor chip as claimed in claim 1, wherein the first reflective layer sequence comprises at least one layer which contains a metal.

3. The optoelectronic semiconductor chip as claimed in claim 2, wherein the first reflective layer sequence comprises at least one layer which contains at least one of the following metals: aluminum, silver.

4. The optoelectronic semiconductor chip as claimed in claim 1, wherein the first reflective layer sequence comprises at least one layer which contains a dielectric material.

5. The optoelectronic semiconductor chip as claimed in claim 4, wherein the first reflective layer sequence forms a Bragg mirror.

6. The optoelectronic semiconductor chip as claimed in claim 1, wherein the second reflective layer sequence comprises at least one layer which contains a metal comprising at least one of aluminum and silver.

7. The optoelectronic semiconductor chip as claimed in claim 1, wherein the second reflective layer sequence comprises at least one layer which contains a dielectric material.

8. The optoelectronic semiconductor chip as claimed in claim 7, wherein the second reflective layer sequence forms a Bragg mirror.

9. An optoelectronic semiconductor component comprising:
    a radiation passage area;
    a contact metallization applied to the radiation passage area;
    a first reflective layer sequence applied to that surface of the contact metallization which is remote from the radiation passage area; and
    an optical filter element comprising a luminescence conversion material disposed downstream of the optoelectronic semiconductor chip in an emission direction, said optical filter element being configured to transmit a first radiation component having a first radiation property and to reflect a second radiation component having a second radiation property, which differs from the first radiation property.

10. The optoelectronic semiconductor component as claimed in claim 9, wherein the optical filter element comprises a dichroic filter.

11. The optoelectronic semiconductor component as claimed in claim 9, wherein the optical filter element comprises a polarization filter.

12. The optoelectronic semiconductor component as claimed in claim 9, wherein the optical filter element comprises an angle filter.

13. The optoelectronic semiconductor component as claimed in claim 9, wherein at least one current spreading track is applied to the radiation passage area of the optoelectronic semiconductor chip, wherein the current spreading track is electrically conductively connected to the contact metallization.

14. The optoelectronic semiconductor chip as claimed in claim 13, wherein the current spreading track has a current spreading metallization and also a second reflective layer sequence applied to that surface of the current spreading metallization which is remote from the radiation passage area, wherein the second reflective layer sequence is provided for reflecting of electromagnetic radiation reflected back to the current spreading metallization.

* * * * *